(12) United States Patent
Fujihara et al.

(10) Patent No.: US 12,389,731 B2
(45) Date of Patent: Aug. 12, 2025

(54) SEMICONDUCTOR DEVICE, METHOD FOR MANUFACTURING SAME, AND SUBSTRATE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Mami Fujihara, Nakatsu Oita (JP); Masahiko Hori, Yokohama Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 648 days.

(21) Appl. No.: 17/667,870

(22) Filed: Feb. 9, 2022

(65) Prior Publication Data
US 2022/0406980 A1 Dec. 22, 2022

(30) Foreign Application Priority Data
Jun. 16, 2021 (JP) .................. 2021-100151

(51) Int. Cl.
*H10H 20/857* (2025.01)
*H01L 25/075* (2006.01)
(Continued)

(52) U.S. Cl.
CPC ....... *H10H 20/857* (2025.01); *H01L 25/0753* (2013.01); *H10H 20/01* (2025.01);
(Continued)

(58) Field of Classification Search
CPC ......... H01L 2224/32145; H01L 25/167; H01L 23/3114; H01L 33/62; H01L 25/0753;
(Continued)

(56) References Cited

U.S. PATENT DOCUMENTS 4,859,993 A * 8/1989 Kagami ............ H01L 21/67265
377/53
6,469,382 B1 10/2002 Hotozuka et al.
(Continued)

FOREIGN PATENT DOCUMENTS

CN 107275436 A 10/2017
CN 110890340 A 3/2020
(Continued)

OTHER PUBLICATIONS

First Office Action mailed May 30, 2024, in corresponding Chinese Patent Application No. 202210021022.0, 18 pages (with Translation).

(Continued)

*Primary Examiner* — William B Partridge
*Assistant Examiner* — Felix B Andrews
(74) *Attorney, Agent, or Firm* — Kim & Stewart LLP (57) ABSTRACT

A semiconductor device includes an insulating member; a light-receiving element on a front surface of the insulating member; a light-emitting element on the light-receiving element; a first metal terminal electrically connected to the light-emitting element and provided on a back surface of the insulating member; a switching element mounted on the front surface via a metal pad, the switching element being electrically connected to the light-receiving element; and a second metal terminal provided on the back surface and electrically connected to the switching element via the metal pad. The insulating member has a first thickness in a first direction directed from the back surface toward the front surface. The metal pad has a second thickness in the first direction. The second metal terminal has a third thickness in the first direction. The first thickness is less than a combined thickness of the second and third thicknesses.

15 Claims, 8 Drawing Sheets

(51) Int. Cl.
*H10H 20/01* (2025.01)
*H10H 20/854* (2025.01)

(52) U.S. Cl.
CPC ....... *H10H 20/854* (2025.01); *H10H 20/0362* (2025.01); *H10H 20/0364* (2025.01)

(58) Field of Classification Search
CPC . H01L 33/005; H01L 33/56; H01L 2933/005; H01L 2933/0066; H01L 2224/0603; H01L 2224/48137; H01L 2224/73265; H01L 2224/8592; H01L 2924/181; H01L 33/52; H01L 33/0095; H01L 2224/92247; H01L 21/56; H01L 23/3121; H01L 23/49
See application file for complete search history.

(56) References Cited

U.S. PATENT DOCUMENTS

| | | | | |
|---|---|---|---|---|
| 2003/0057534 A1* | 3/2003 | Ho | ................ | H01L 23/4334 |
| | | | | 257/E23.105 |
| 2010/0193757 A1* | 8/2010 | Suga | ................ | H10N 70/20 |
| | | | | 257/1 |
| 2015/0060892 A1* | 3/2015 | Noguchi | ................ | H01L 31/14 |
| | | | | 257/82 |
| 2015/0069423 A1 | 3/2015 | Yamamoto et al. | | |
| 2017/0018536 A1* | 1/2017 | Okumura | ............ | H01L 29/8611 |
| 2020/0083150 A1 | 3/2020 | Shimizu et al. | | |
| 2020/0091367 A1* | 3/2020 | Nakashima | ........... | H01L 25/167 |
| 2020/0161494 A1 | 5/2020 | Fujihara et al. | | |
| 2021/0175221 A1 | 6/2021 | Tonedachi | | |
| 2021/0195070 A1 | 6/2021 | Shibata et al. | | |

FOREIGN PATENT DOCUMENTS

| | | | | |
|---|---|---|---|---|
| CN | 111211198 A | | 5/2020 | |
| CN | 112908939 A | | 6/2021 | |
| DE | 102010027748 A1 | * | 10/2011 | ............ H01L 33/46 |
| JP | 2000-277688 A | | 10/2000 | |
| JP | 2001-210755 A | | 8/2001 | |
| JP | 2004-103654 A | | 4/2004 | |
| JP | 2015-056531 A | | 3/2015 | |
| JP | 2016042607 | * | 3/2016 | |
| JP | 2019-079990 A | | 5/2019 | |
| JP | 2021-089971 A | | 6/2021 | |

OTHER PUBLICATIONS

Notice of Reasons for Refusal mailed May 23, 2024, in corresponding Japanese Patent Application No. 2021-100151, 11 pages (with Translation).

* cited by examiner

SEMICONDUCTOR DEVICE, METHOD FOR MANUFACTURING SAME, AND SUBSTRATE

CROSS-REFERENCE TO RELATED APPLICATIONS

This application is based upon and claims the benefit of priority from Japanese Patent Application No. 2021-100151, filed on Jun. 16, 2021; the entire contents of which are incorporated herein by reference.

FIELD

Embodiments relate to a semiconductor device, a method for manufacturing the same, and a substrate.

BACKGROUND

A semiconductor device that transmits a high frequency signal is required to improve the frequency characteristics. For a photo-relay that includes an optically coupled light-emitting and light-receiving elements, for example, it is desirable to improve the high frequency pass characteristics by reducing the impedance between the output-side terminals.

BRIEF DESCRIPTION OF THE DRAWINGS

FIGS. 5A to 6B are schematic views showing manufacturing processes of the semiconductor device according to the embodiment;

DETAILED DESCRIPTION

According to one embodiment, a semiconductor device includes an insulating member; a light-receiving element mounted on a front surface of the insulating member; a light-emitting element mounted on the light-receiving element and optically coupled with the light-receiving element; a first metal terminal electrically connected to the light-emitting element and provided on a back surface of the insulating member at a side opposite to the front surface; a switching element mounted on the front surface of the insulating member via a metal pad, the switching and light-receiving elements being arranged along the front surface of the insulating member, the switching element being electrically connected to the light-receiving element; and a second metal terminal provided on the back surface of the insulating member and electrically connected to the switching element via the metal pad. The insulating member has a first thickness in a first direction directed from the back surface toward the front surface. The metal pad has a second thickness in the first direction. The second metal terminal has a third thickness in the first direction. The first thickness is less than a combined thickness of the second and third thicknesses.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

Figure 1:
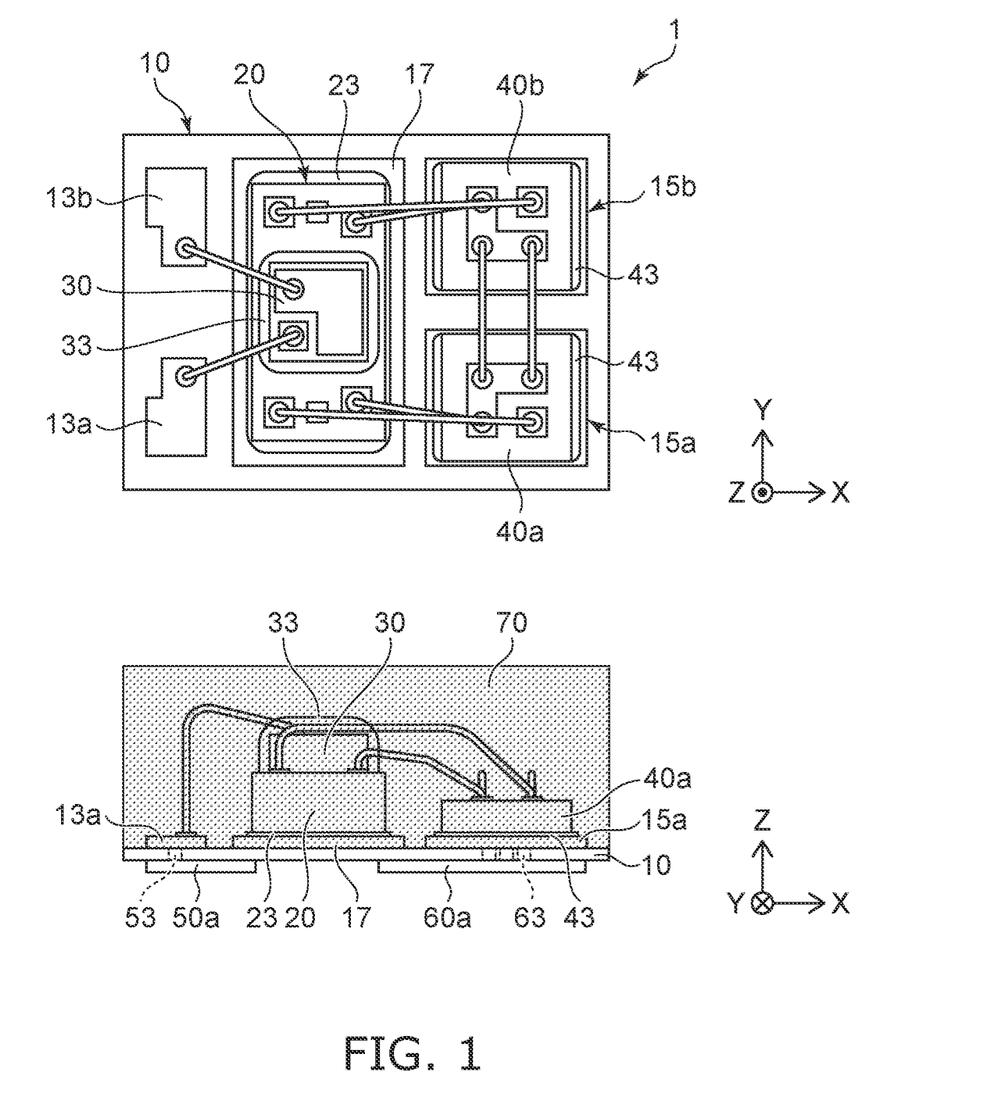
FIG. 1 is a schematic view showing the semiconductor device according to the embodiment.
Figure 2:
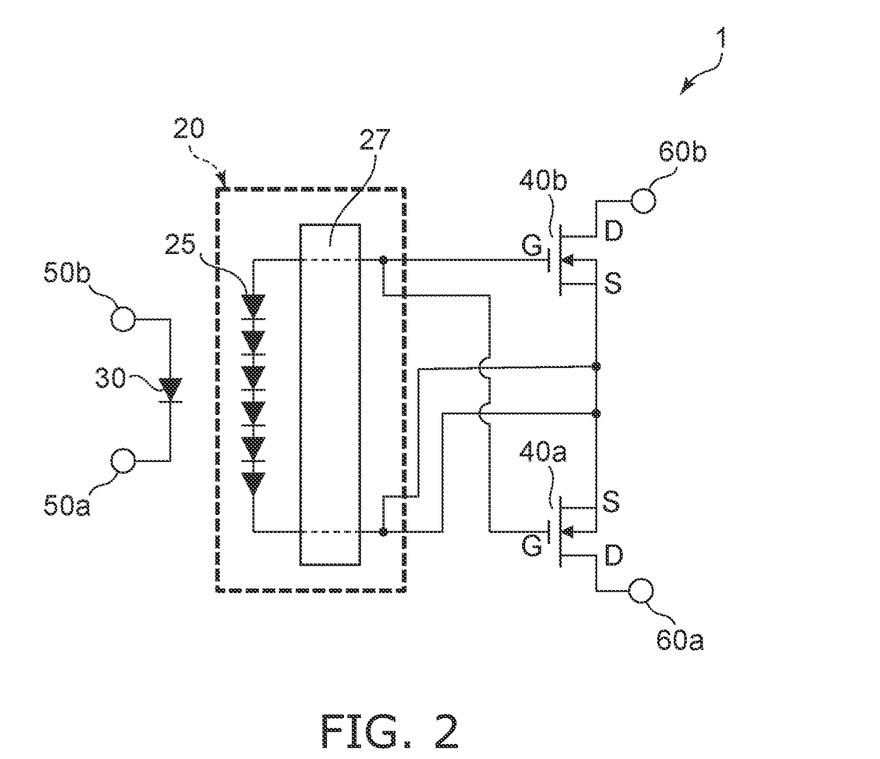
FIG. 2 is a circuit diagram showing the configuration of the semiconductor device according to the embodiment.

FIGS. 1 and 2 are schematic views illustrating a semiconductor device 1 according to an embodiment. FIG. 1 is a schematic view showing the semiconductor device 1 according to the embodiment. FIG. 2 is a circuit diagram showing the semiconductor device 1 according to the embodiment.

The semiconductor device 1 is, for example, a photo-relay. The semiconductor device 1 includes an insulating member 10, a light-receiving element 20, a light-emitting element 30, switching elements 40a and 40b.

The insulating member 10 is, for example, an insulating resin sheet. The insulating member 10 includes, for example, polyimide. The thickness of the insulating member 10 in a direction from the back surface toward the front surface (e.g., the Z-direction) is, for example, 50 micrometers (μm).

For example, bonding pads 13a and 13b and mount pads 15a, 15b, and 17 are provided on the front surface of the insulating member 10. The bonding pads 13a and 13b and the mount pads 15a, 15b, and 17 are, for example, metal layers that include copper. The thicknesses in the Z-direction of the bonding pads 13a and 13b and the mount pads 15a, 15b, and 17 each are, for example, 30 μm.

The bonding pad 13a and the bonding pad 13b are arranged in a Y-direction, for example. The mount pads 15a and 15b are arranged in the Y-direction, for example.

The bonding pad 13a and the mount pad 15a, for example, are arranged in an X-direction. The bonding pad 13b and the mount pad 15b are arranged in the X-direction, for example.

The mount pad 17, for example, is provided between the bonding pad 13a and the mount pad 15a and between the bonding pad 13b and the mount pad 15b.

Control-side terminals 50a and 50b and output-side terminals 60a and 60b (referring to FIG. 3C) are provided on the back surface of the insulating member 10. The control-side terminals 50a and 50b and the output-side terminals 60a and 60b are, for example, metal layers that include copper. The thicknesses in the Z-direction of the control-side terminals 50a and 50b and the output-side terminals 60a and 60b each are, for example, 30 μm.

The control-side terminal 50a faces the bonding pad 13a via the insulating member 10. The control-side terminal 50a is electrically connected to the bonding pad 13a by a via contact 53 provided in the insulating member 10. The via contact 53 includes, for example, the same material as the control-side terminal 50a. The via contact 53 includes, for example, copper. Other via contacts also are similarly provided.

The control-side terminal 50b faces the bonding pad 13b via the insulating member 10. The control-side terminal 50b is electrically connected to the bonding pad 13b by a via contact (not-illustrated).

The output-side terminal 60a faces the mount pad 15a via the insulating member 10. The output-side terminal 60a is electrically connected to the mount pad 15a by a via contact 63 provided in the insulating member 10. The output-side terminal 60a, for example, is electrically connected to the mount pad 15a by multiple via contacts 63.

The output-side terminal 60b faces the mount pad 15b via the insulating member 10. The output-side terminal 60b is electrically connected to the mount pad 15b by a via contact (not-illustrated).

The light-receiving element 20 is mounted on the mount pad 17 via a bonding material 23. The bonding material 23 is, for example, a solder material or a conductive paste, in some cases non-conductive materials. The light-emitting element 30, for example, is mounted on the light-receiving element 20 via a transmissive coupling material 35 (referring to FIG. 5B) and is optically coupled to the light-receiving element 20. The light-receiving element 20 includes, for example, a silicon photodiode. The light-emitting element 30 is, for example, a light-emitting diode (LED).

The switching elements 40a and 40b are mounted respectively on the mount pads 15a and 15b via bonding materials 43. The bonding materials 43 are, for example, solder materials or conductive pastes.

The switching elements 40a and 40b are, for example, vertical MOSFETs that include drains at the backsides and sources at the front sides. The switching elements 40a and 40b are mounted so that the back surfaces of the switching elements 40a and 40b face the mount pads 15a and 15b, respectively. The switching element 40a is electrically connected to the output-side terminal 60a via the mount pad 15a and the via contacts 63. The switching element 40b is electrically connected to the output-side terminal 60b via the mount pad 15b and the via contacts (not illustrated).

As shown in FIG. 1, the light-receiving element 20 is electrically connected to the switching elements 40a and 40b via metal wires (referring to FIG. 1). The switching element 40a and the switching element 40b are electrically connected via other metal wires (referring to FIG. 1).

The light-emitting element 30 is electrically connected to the bonding pads 13a and 13b via yet other metal wires (referring to FIG. 1). The light-emitting element 30 is electrically connected to the control-side terminal 50a via the bonding pad 13a and the via contact 53. Also, the light-emitting element 30 is electrically connected to the control-side terminal 50b via the bonding pad 13b and the via contact (not illustrated).

As shown in FIG. 1, a resin member 70 is provided at the front side of the insulating member 10. The resin member 70 is, for example, an epoxy resin. The resin member 70 is, for example, non-transmissive. The resin member 70 seals the light-receiving element 20, the light-emitting element 30, the switching elements 40a and 40b, and the metal wires on the insulating member 10. The light-emitting element 30 is sealed on the light-receiving element 20 by a resin member 33. The resin member 70 covers the resin member 33. The resin member 33 is, for example, silicone.

Thus, the semiconductor device 1 has a structure that seals the light-receiving element 20, the light-emitting element 30, and the switching elements 40a and 40b inside a resin package and includes a control-side terminal 50 and an output-side terminal 60 at the outer surface of the resin package.

In the semiconductor device 1, the resin member 70 contacts the insulating member 10 between the pads (13a, 13b, 15a, 15b and 17). The resin member 70 also contacts the insulating member 10 at the outer edge of the insulating member 10. The adhesion strength between the insulating member 10 and the resin member 70 is improved thereby, and the reliability of the light-receiving element 20, the light-emitting element 30, and the switching elements 40a and 40b can be increased by sealing with the resin member 70. Moreover, the resin package can be provided such that no metal other than the control terminals 50a, 50b, the output terminals 60a and 60b is exposed at the outer surface thereof. When mounting the resin package using a connection member such as a solder cream or the like, it is possible to prevent the connection member from penetrating into the resin package due to capillary action, creeping up of the solder material, and like.

As shown in FIG. 2, the light-receiving element 20 includes multiple photodiodes 25 and a control circuit 27. The multiple photodiodes 25 are connected in series. The photodiodes 25 are configured to detect the light of the light-emitting element 30. The control circuit 27 is, for example, a waveform shaping circuit. The control circuit 27 may be a discharging circuit, a protection circuit, etc. The output of the photodiodes 25 is output via the control circuit 27.

The switching elements 40a and 40b each have a source S, a drain D and a gate G. The source S of the switching element 40a is connected to the source S of the switching element 40b. The cathode-side output of the photodiodes 25 is connected to, for example, the sources S of the switching elements 40a and 40b via the control circuit 27. The anode-side output of the photodiodes 25 is connected to, for example, the gates G of the switching elements 40a and 40b via the control circuit 27. The output-side terminal 60a is connected to the drain D of the switching element 40a; and the output-side terminal 60b is connected to the drain D of the switching element 40b.

For example, a control signal is input to the control-side terminals 50a and 50b so that the electrical conduction between the output-side terminal 60a and the output-side terminal 60b is on-off controlled. The light-emitting element 30 radiates an optical signal corresponding to the control signal; and the light-receiving element 20 detects the optical signal radiated from the light-emitting element 30 and outputs a control signal corresponding to the optical signal to the switching elements 40a and 40b.

When the semiconductor device 1 performs the on-off control of the electrical conduction between the output-side terminals 60a and 60b by the high frequency signal transmitted from the control-side terminals 50a and 50b, for example, it is desirable to improve the passing through characteristics of the high frequency signal between the output-side terminals 60a and 60b. In the semiconductor device 1, by reducing the thickness in the Z-direction of the insulating member 10, the impedances are reduced between the switching element 40a and the output-side terminal 60a and between the switching element 40b and the output-side terminal 60b. Thereby, the passing through characteristics of the high frequency signal can be improved between the output-side terminals 60a and 60b.

Figure 3A:
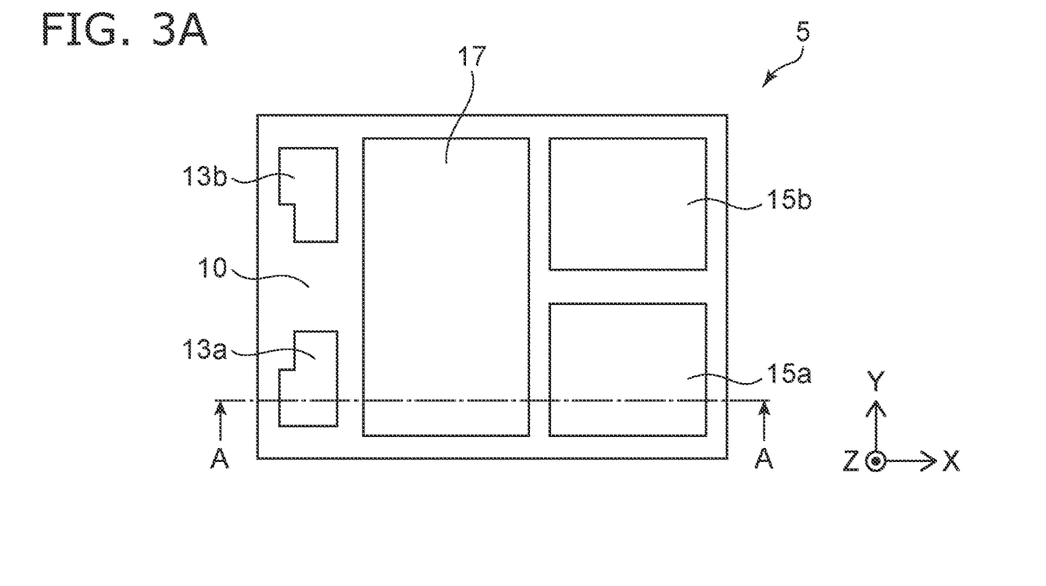
FIGS. 3A to 3C are schematic views showing a base member of the semiconductor device according to the embodiment.
Figure 3B:
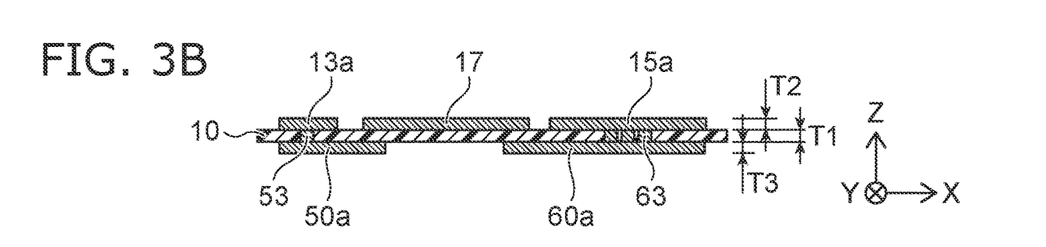
Figure 3C:
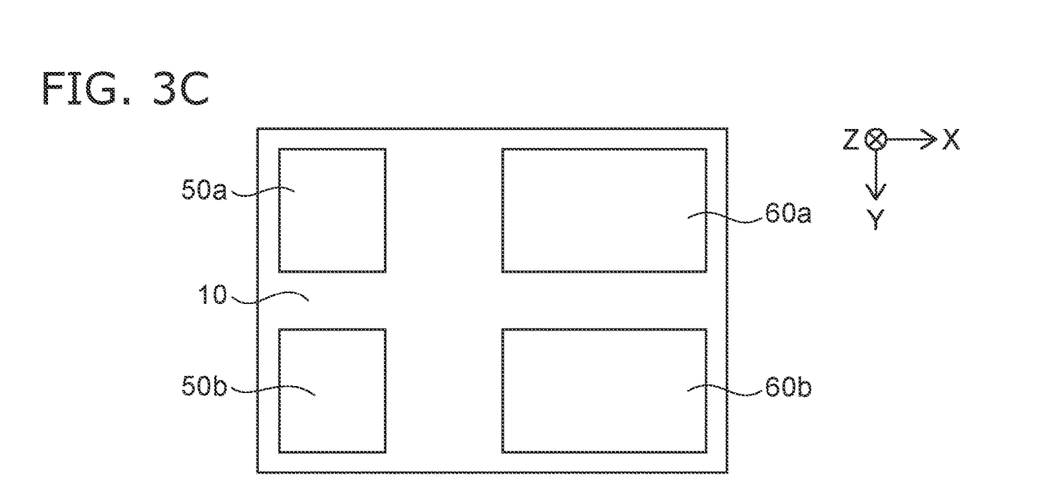

FIGS. 3A to 3C are schematic views showing a base member 5 of the semiconductor device 1 according to the embodiment. The base member 5 includes the insulating member 10, the bonding pads 13a, 13b, the mount pads 15a, 15b, 17, the control-side terminals 50a, 50b, the output-side terminals 60a and 60b. The light-receiving element 20, the light-emitting element 30, and the switching elements 40a and 40b (referring to FIG. 1) are mounted at the front side of the base member 5.

FIG. 3A is a plan view showing the bonding pads 13a and 13b and the mount pads 15a, 15b, and 17 provided at the front side of the insulating member 10. The bonding pads 13a and 13b and the mount pads 15a, 15b, and 17, for example, are formed by patterning a copper foil provided on the front surface of the insulating member 10. The bonding pads 13a and 13b and the mount pads 15a, 15b, and 17 may have a stacked structure in which a gold (Au) layer for oxidation prevention is provided at the front surface.

The bonding pads 13a and 13b are arranged in the Y-direction. The mount pads 15a and 15b are arranged in the Y-direction. The mount pad 17 is provided between the bonding pad 13a and the mount pad 15a and between the bonding pad 13b and the mount pad 15b. The embodiment is not limited to this arrangement.

FIG. 3B is a cross-sectional view along line A-A shown in FIG. 3A. The insulating member 10 has a thickness T1 in the Z-direction. The bonding pads 13a and 13b and the mount pads 15a, 15b, and 17 each have a thickness T2 in the Z-direction. The control terminals 50a and 50b and the output-side terminals 60a and 60b that are provided on the back surface of the insulating member 10 each have a thickness T3 in the Z-direction.

The via contact 53 and the via contact 63 are provided in the insulating member 10. The via contacts 53 and 63, for example, are provided in via holes that communicate from the backside to the front side of the insulating member 10. For example, the via contacts 53 and 63 are formed by filling the via holes with a metal such as copper, etc., by plating.

The control-side terminal 50a is electrically connected to the bonding pad 13a by the via contact 53. The output-side terminal 60a is electrically connected to the mount pad 15a by the via contacts 63. Similarly, the control terminal 50b and the output terminal 60b are electrically connected to the bonding pad 13b and the mount pad 15b, respectively, by via contacts (not shown).

FIG. 3C is a plan view showing the control-side terminals 50a and 50b and the output-side terminals 60a and 60b that are provided at the backside of the insulating member 10. The control-side terminals 50a and 50b and the output-side terminals 60a and 60b, for example, are formed by patterning a copper foil that is provided on the back surface of the insulating member 10. The control terminal 50b and the output-side terminal 60b have the same thickness T3 in the Z-direction as the control terminal 50a and the output-side terminal 60a. The control-side terminals 50a and 50b and the output-side terminals 60a and 60b may have stacked structures in which gold (Au) layers for oxidation prevention are provided at the front surfaces.

The control-side terminals 50a and 50b, for example, are arranged in the Y-direction. The output-side terminals 60a and 60b, for example, are arranged in the Y-direction. The control-side terminal 50a and the output-side terminal 60a, for example, are arranged in the X-direction. The control-side terminal 50b and the output-side terminal 60b, for example, are arranged in the X-direction.

The control-side terminal 50a faces the bonding pad 13a via the insulating member 10. The control-side terminal 50b faces the bonding pad 13b via the insulating member 10.

The output-side terminal 60a faces the mount pad 15a via the insulating member 10. The output-side terminal 60b faces the mount pad 15b via the insulating member 10.

The insulating member 10, for example, has the thickness T1 that is preferably thin to reduce the impedance between the switching element 40a and the output-side terminal 60a and the impedance between the switching element 40b and the output-side terminal 60b.

The bonding pads 13a and 13b, for example, are provided with thicknesses such that enough bonding strength of the metal wires (referring to FIG. 1) can be achieved. The bonding pads 13a and 13b provided at the front side of the insulating member 10 each have the thickness T2 in the Z-direction that is preferably thicker than a prescribed thickness that provides the enough bonding strength.

The control-side terminals 50a and 50b and the output-side terminals 60a and 60b that are provided at the backside of the insulating member 10, for example, each have preferably the thickness T3 same as the thickness T2 of the bonding pads 13a and 13b and the mount pads 15a, 15b, and 17 to balance the stress applied to the insulating member 10. Here, "the same" means not only an exact match but also includes about the same or substantially the same.

Figure 4A:
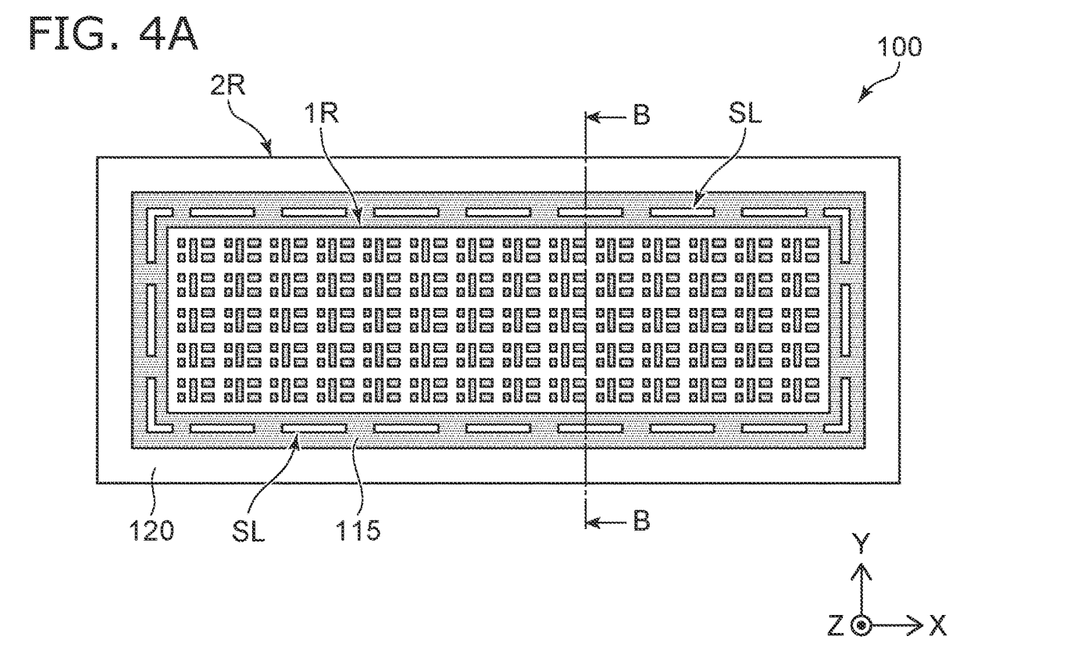
FIGS. 4A and 4B are schematic views showing a substrate used to manufacture the semiconductor device according to the embodiment.
Figure 4B:
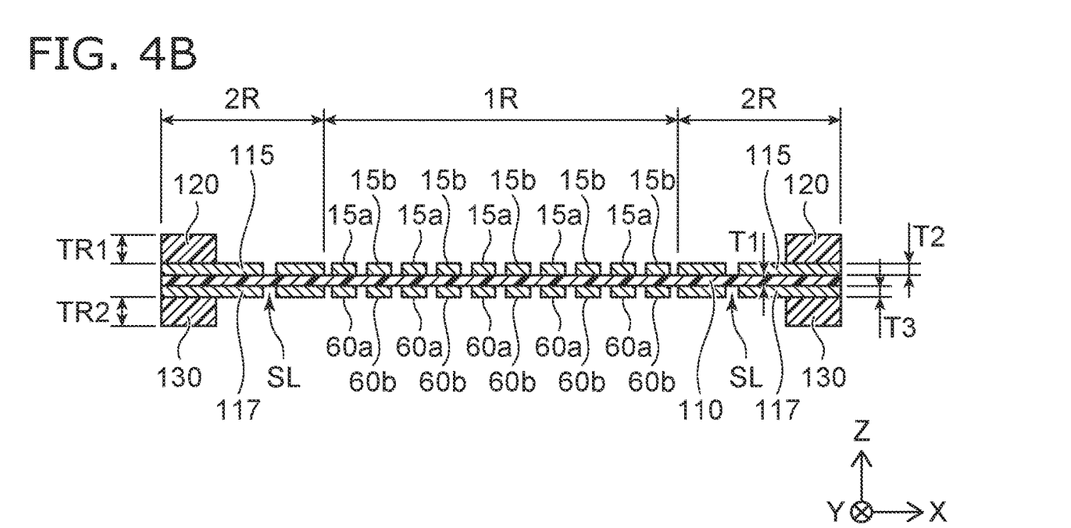

On the other hand, when the thickness T2 of the bonding pads 13a and 13b and the mount pads 15a, 15b, and 17 and the thickness T3 of the control-side terminals 50a and 50b and the output-side terminals 60a and 60b are too thick, it becomes difficult to cut the stacked structure of the insulating member 10 and the metal layers provided on the front and back surfaces of the insulating member 10 (referring to FIG. 4B).

As a result, the insulating member 10 has preferably the thickness T1 less than the combined thickness (T2+T3) of the thickness T2 of the bonding pads 13a and 13b and the mount pads 15a, 15b, and 17 and the thickness T3 of the control-side terminals 50a and 50b and the output-side terminals 60a and 60b. Thereby, the impedance can be reduced between the switching element 40a and the output-side terminal 60a and between the switching element 40b and the output-side terminal 60b.

In view of cutting the stacked structure, the thicknesses T2 and T3 each are preferably less than the thickness T1 of the insulating member 10. At the front surface and the back surface of the insulating member 10, for example, the metal layers are formed simultaneously; and the thickness T2 is the same as the thickness T3. The thickness T1 of the insulating member 10 is, for example, 50 µm. The thickness T2 and the thickness T3 each are, for example, 30 µm.

FIGS. 4A and 4B are schematic views showing a substrate 100 used to manufacture the semiconductor device 1 according to the embodiment. FIG. 4A is a plan view showing the entire substrate 100. FIG. 4B is a cross-sectional view along line B-B shown in FIG. 4A.

As shown in FIG. 4A, the substrate 100 includes a first region 1R and a second region 2R. The second region 2R surrounds the first region 1R.

The first region 1R includes multiple bonding pads 13a, multiple bonding pads 13b, multiple mount pads 15a, multiple mount pads 15b, and multiple mount pads 17. The first region 1R also includes multiple control-side terminals 50a, multiple control-side terminals 50b, multiple output-side terminals 60a, and multiple output-side terminals 60b that are provided at the backside (not illustrated).

The bonding pads 13a and 13b and the mount pads 15a, 15b, and 17, for example, are arranged in the X-direction and the Y-direction while maintaining the arrangement shown in FIG. 3A. Also, for example, the control-side terminals 50a and 50b and the output-side terminals 60a and 60b are arranged in the X-direction and the Y-direction while maintaining the arrangement shown in FIG. 3C.

The second region 2R includes, for example, a metal layer 115 and a resin layer 120. The metal layer 115, for example, remains in the process of forming the bonding pads 13a and 13b and the mount pads 15a, 15b, and 17. The metal layer 115 surrounds the first region 1R. The resin layer 120 surrounds the first region 1R on the metal layer 115. The metal layer 115 is, for example, a copper foil. The resin layer 120 includes, for example, polyimide. The metal layer 115 may have a stacked structure in which a gold (Au) layer is formed on a copper foil.

The metal layer 115 includes a region that is exposed between the first region 1R and the resin layer 120. The metal layer 115 includes multiple slits SL that are arranged to surround the first region 1R. The slits SL each extend along the outer edge of the first region 1R in the region where the metal layer 115 is exposed. The slits SL, for example, are provided on a line surrounding the first region 1R (referring to FIG. 6A). The slits SL may be linked at each of the four corners of the quadrilateral first region 1R and surround each corner thereof.

As shown in FIG. 4B, the substrate 100 includes a sheet-like insulating member 110. The base member 5 is formed by cutting the first region 1R of the substrate 100. The insulating member 10 is formed by dividing the insulating member 110. The insulating member 110 includes polyimide. The metal layer 115 includes a region that is provided between the insulating member 110 and the resin layer 120. The metal layer 115 has the thickness T2 in the Z-direction. The slit SL is provided to communicate from the front surface of the metal layer 115 to the insulating member 110.

A metal layer 117 and a resin layer 130 are provided at the backside of the insulating member 110. The metal layer 117 is provided in the second region 2R and surrounds the first region 1R. The control-side terminals 50a and 50b and the output-side terminals 60a and 60b are formed by patterning the metal layer 117 that covers the whole back surface of the insulating member 110. The resin layer 130 is provided on the metal layer 117. The metal layer 117 includes a region that is positioned between the insulating member 110 and the resin layer 130. The metal layer 117 has the thickness T3 in the Z-direction. The metal layer 117 is, for example, a copper foil. The metal layer 117 may have a stacked structure in which a gold (Au) layer is formed on a copper foil.

The metal layer 117 includes a region that is exposed between the first region 1R and the resin layer 130. The slits SL are also provided in the exposed region of the metal layer 117. The slits SL that are provided at the backside of the insulating member 110 are provided at positions opposite to the slits SL provided at the front side of the insulating member 110.

The resin layer 120 and the resin layer 130 suppress the warp and/or the deformation of the substrate 100, for example, due to the heat while mounting the light-receiving elements 20 and the switching elements 40a and 40b and while bonding the metal wires. The positional accuracy after transferring the substrate 100 can be increased by suppressing the warp and/or the deformation thereof.

The resin layer 120 has a thickness TR1 in the Z-direction; and the resin layer 130 has a thickness TR2 in the Z-direction. The thickness TR1 of the resin layer 120 and the thickness TR2 of the resin layer 130, for example, are greater than the thickness T1 of the insulating member 110.

The thickness TR1 of the resin layer 120 and the thickness TR2 of the resin layer 130 each are, for example, 150 μm.

The resin layer 120 and the resin layer 130 do not always have the same thickness; and the thicknesses TR1 and TR2 can be adjusted to suppress the warp of the substrate 100. For example, one of TR1 or TR2 may be 0 μm. In other words, the substrate 100 may have a configuration in which one of the resin layers 120 or 130 is provided.

A method for manufacturing the semiconductor device 1 will now be described with reference to FIGS. 5A to 6B. FIGS. 5A to 6B are schematic views showing manufacturing processes of the semiconductor device 1 according to the embodiment.

Figure 5A:
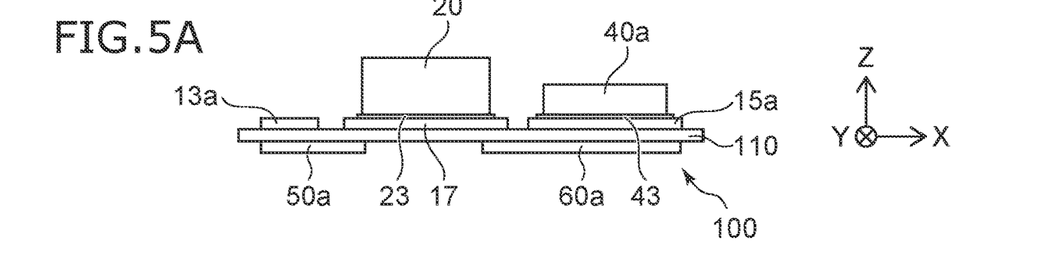

As shown in FIG. 5A, the switching element 40a and the light-receiving element 20 are mounted respectively on the mount pads 15a and 17 that are provided on the insulating member 110. The switching element 40a and the light-receiving element 20 are placed on the mount pads 15a and 17 via, for example, a solder cream or a conductive paste, and are fixed by reflow or curing. The switching element 40b is mounted on the mount pad 15b at a portion not-illustrated.

Figure 5B:
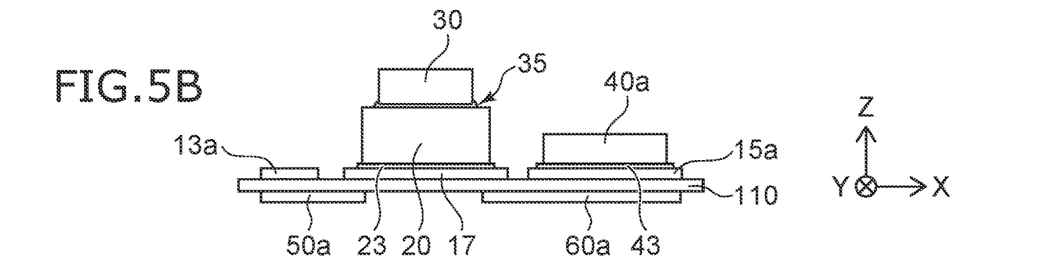

As shown in FIG. 5B, the light-emitting element 30 is mounted on the light-receiving element 20. The light-emitting element 30, for example, is bonded to the light-receiving element 20 via the bonding material 35. The light-emitting element 30 radiates light toward the light-receiving element 20 from the back surface that faces the light-receiving element 20. The bonding material 35 is, for example, a transparent resin layer that transmits the light radiated by the light-emitting element 30.

Figure 5C:
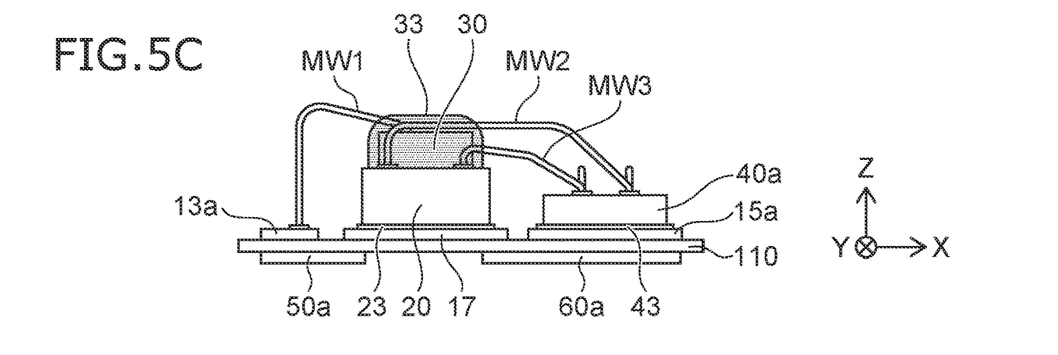

As shown in FIG. 5C, the bonding pad 13a and the light-emitting element 30 are electrically connected by a metal wire MW1 (referring to FIG. 2). The light-receiving element 20 and the switching element 40a are electrically connected by metal wires MW2 and MW3 (referring to FIG. 2). The metal wires MW1, MW2, and MW3 are connected on the electrodes of the elements by, for example, ultrasonic bonding.

Metal wires also electrically connect between the bonding pad 13b and the light-emitting element 30, between the light-receiving element 20 and the switching element 40b, and between the switching element 40a and the switching element 40b at not-illustrated portions.

The light-emitting element 30 is sealed on the light-receiving element 20 by the resin member 33. The resin member 33 is formed by, for example, potting.

When automatically bonding the metal wires to the electrodes of the elements, the large warp of the substrate 100 may degrade the image recognition function by, for example, a camera and make a failure of bonding and like. When the warp of the insulating member 110, for example, exceeds the focus depth in an angular field of the camera, the accuracy of the image recognition decreases. In the substrate 100 according to the embodiment, such a failure can be avoided by the resin layers 120 and 130 (referring to FIG. 4B) that suppress the warp.

Figure 5D:
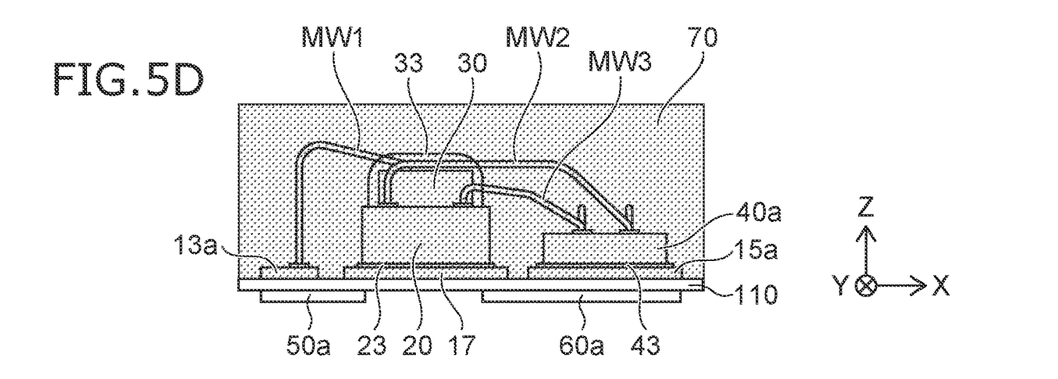

As shown in FIG. 5D, the resin member 70 is formed at the front side of the insulating member 110. The resin member 70 is formed to be closely adhered to the insulating member 110 and to seal the light-receiving element 20, the light-emitting element 30, the switching elements 40a and 40b, and the metal wires MW1 to MW3.

Figure 6A:
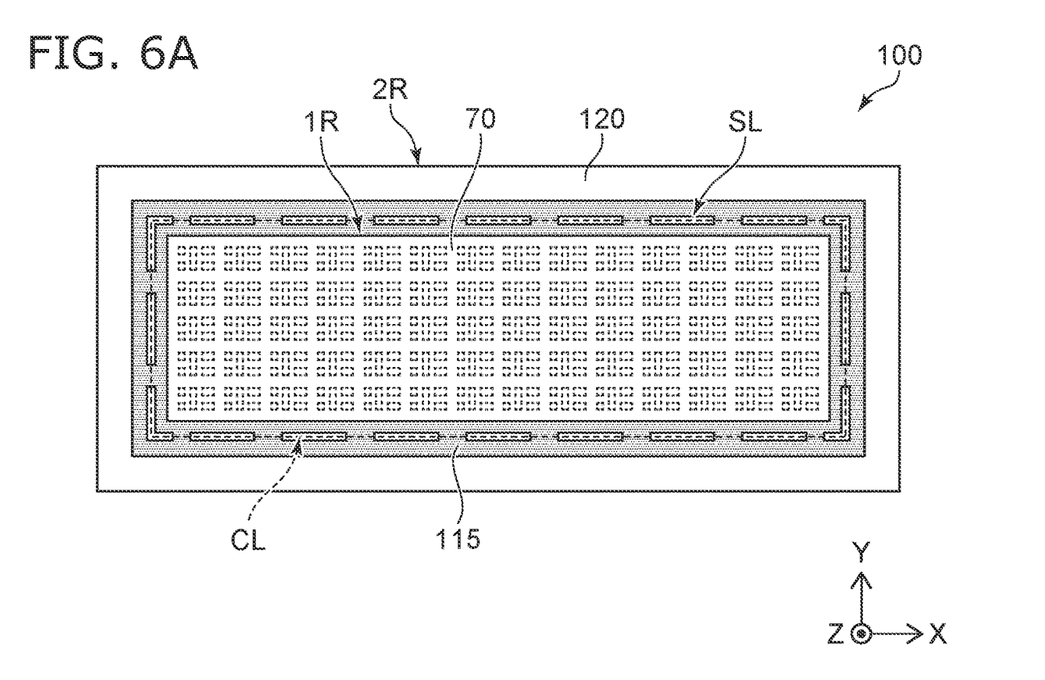

As shown in FIG. 6A, the resin member 70 is formed at the front side of the substrate 100. The resin member 70 is formed to cover the first region 1R of the substrate 100. The resin member 70 is formed using, for example, vacuum molding.

Figure 6B:
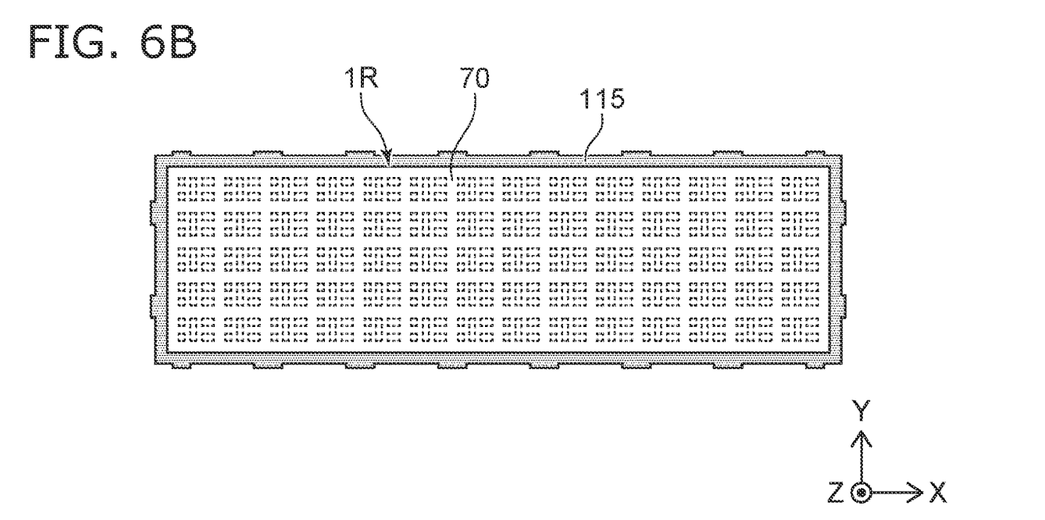

As shown in FIG. 6B, the substrate 100 is cut so that the first region 1R remains with the resin member 70, and the second region 2R is removed. The substrate 100 is cut along a separation line CL along the slits SL.

Then, the semiconductor devices 1 are divided by cutting the resin member 70 and the first region 1R of the substrate 100 in the X-direction and the Y-direction, for example. For example, the substrate 100 and the resin member 70 are cut using a dicer. In the substrate 100 according to the embodiment, the cutting is easy carried out because a metal member is not provided between the semiconductor devices 1 that are adjacent to each other on the first region 1R. Also, no metal burr and the like remains at the divided cross sections of the resin packages.

Figure 7A:
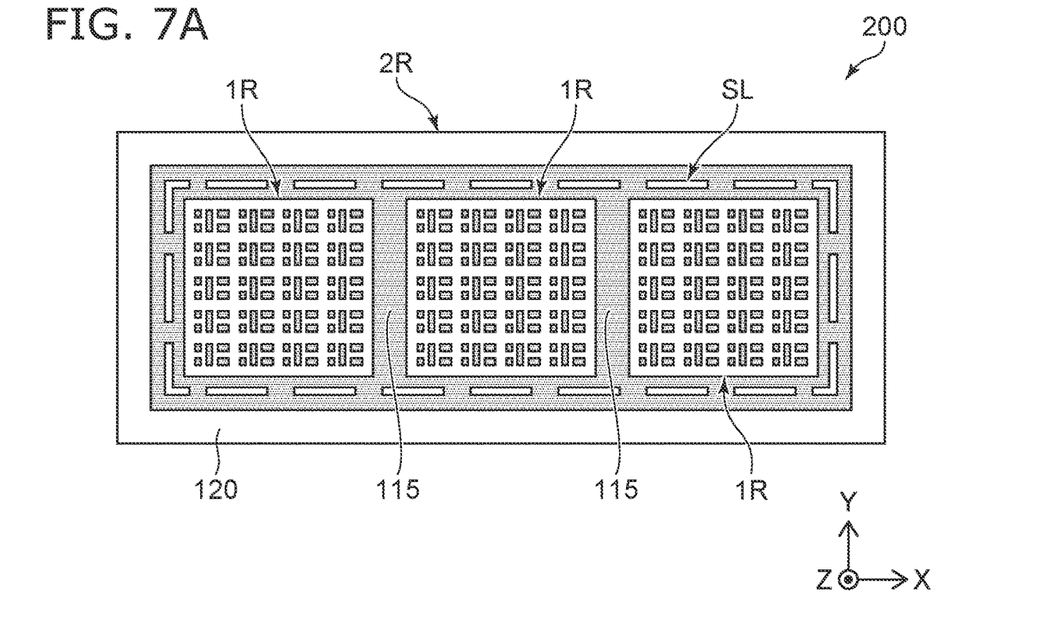
FIGS. 7A and 7B are schematic views showing substrates according to modifications of the embodiment.
Figure 7B:
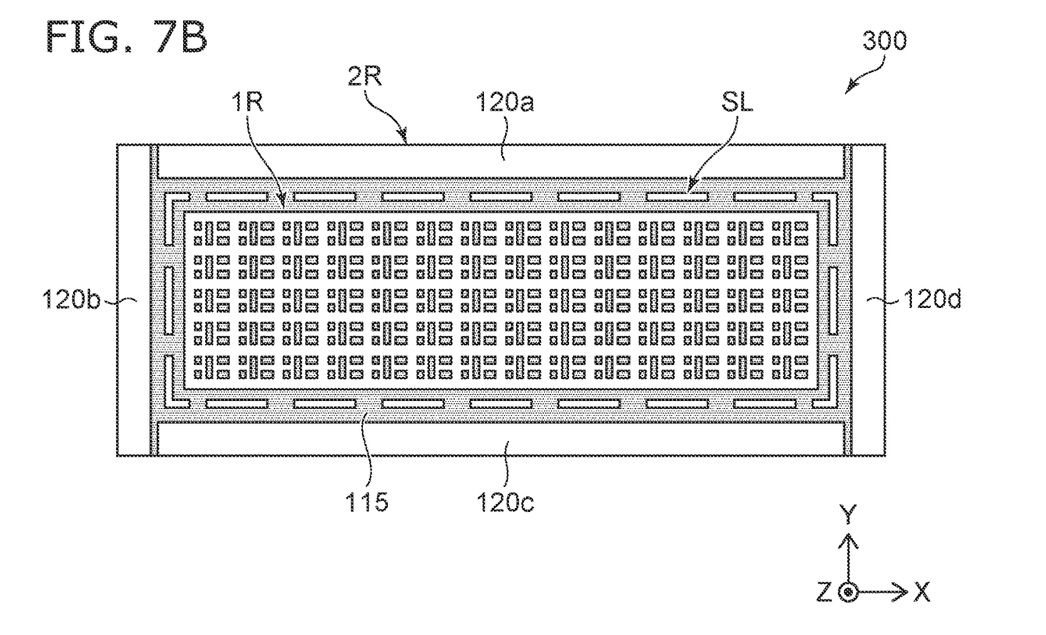

FIGS. 7A and 7B are schematic views showing substrates 200 and 300 according to modifications of the embodiment.

The substrate 200 shown in FIG. 7A includes multiple first regions 1R. The resin layer 120 surrounds the multiple first regions 1R in the second region 2R. The metal layer 115 includes regions that extend between the adjacent first regions 1R. Similarly, the metal layer 117 (referring to FIG. 4B) that is provided at the backside of the insulating member 110 may include regions that extend between the adjacent first regions 1R.

In the example, the first region 1R can be prevented from flexion by the regions of the metal layer 115 that extend between the first regions 1R. This is advantageous, for example, when the surface area of the first region 1R is enlarged and the number of the first semiconductor devices 1 provided in the first region 1R is increased.

In the substrate 300 shown in FIG. 7B, multiple resin layers 120 are provided in the second region 2R. The first region 1R is surrounded with the resin layers 120a to 120d. The metal layer 115 are partially exposed respectively in the space between the resin layer 120a and the resin layer 120b, the space between the resin layer 120b and the resin layer 120c, the space between the resin layer 120c and the resin layer 120d, and the space between the resin layer 120d and the resin layer 120a.

There may be a case where such a configuration of the resin layer 120 is effective for suppressing the warp of the substrate 300. Multiple resin layers 130 also may be provided at the backside of the substrate 300.

Figure 8A:
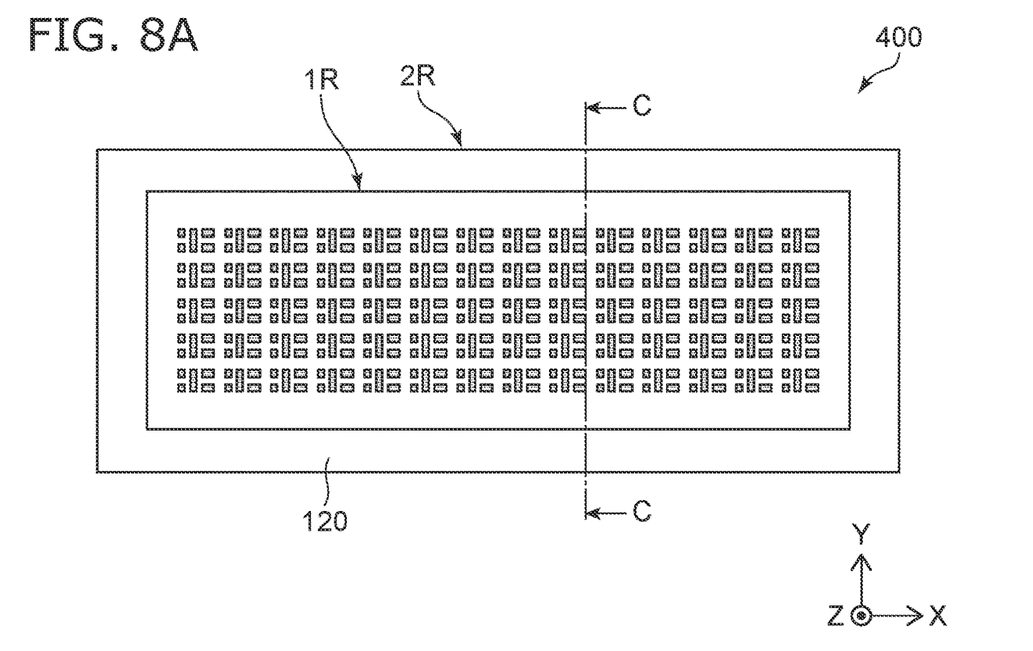
FIGS. 8A and 8B are schematic views showing a substrate according to another modification of the embodiment.
Figure 8B:
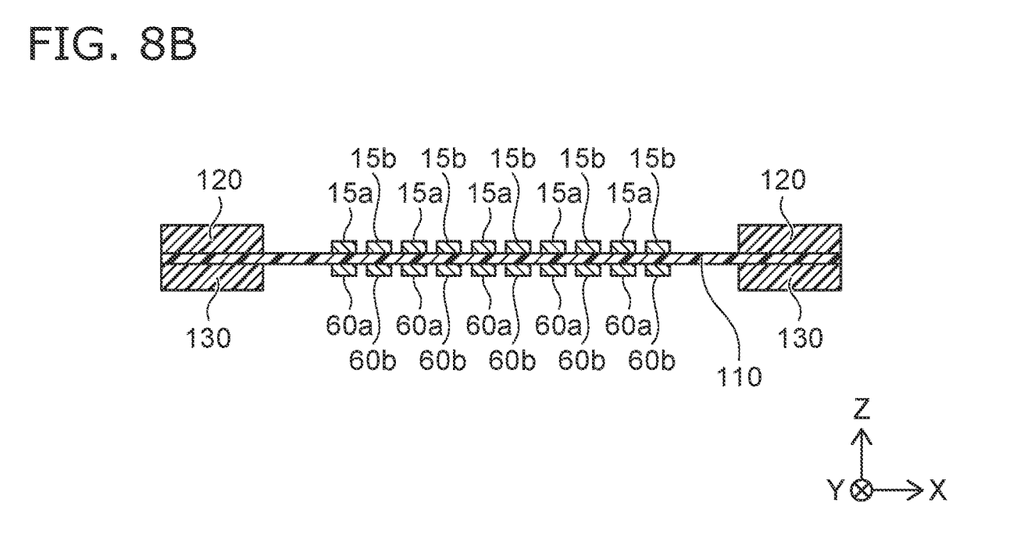

FIGS. 8A and 8B are schematic views showing a substrate 400 according to another modification of the embodiment. FIG. 8A is a plan view showing the entire substrate 400. FIG. 8B is a cross-sectional view along line C-C shown in FIG. 8A.

In the substrate 400 as shown in FIGS. 8A and 8B, the metal layers 115 and 117 are not provided in the second region 2R. The resin layer 120 and the resin layer 130 each are directly provided on the insulating member 110. There are cases where adhesives are interposed to connect the insulating member 110 to the resin layers 120 and 130.

In the example, the metal layers 115 and 117 are not provided between the resin member 70 and the resin layer 120 in the manufacturing process (referring to FIG. 6A), and the insulating member 110 is exposed. Thereby, it is easier to cut the substrate 400 between the resin member 70 and the resin layer 120 so that the first region 1R remains with the resin member 70.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
an insulating member;
a light-receiving element mounted on a front surface of the insulating member;
a light-emitting element mounted on the light-receiving element and optically coupled with the light-receiving element;
a first metal terminal electrically connected to the light-emitting element and provided on a back surface of the insulating member at a side opposite to the front surface;
a switching element mounted on the front surface of the insulating member via a metal pad, the switching and light-receiving elements being arranged along the front surface of the insulating member, the switching element being electrically connected to the light-receiving element; and
a second metal terminal provided on the back surface of the insulating member and electrically connected to the switching element via the metal pad,
the insulating member having a first thickness in a first direction directed from the back surface toward the front surface,
the metal pad being a single layer in contact with the front surface and having a second thickness above the front surface in the first direction, the second thickness being less than the first thickness,
the second metal terminal having a third thickness below the back surface in the first direction, the third thickness being less than the first thickness,
the first thickness being less than a combined thickness of the second and third thicknesses.

2. The device according to claim 1, wherein the insulating member is resin that has the first thickness.

3. The device according to claim 2, wherein the first metal terminal and the second metal terminal contact the back surface of the insulating member, and the metal pad contacts the front surface of the insulating member.

4. The device according to claim 1, wherein the first metal terminal has a same thickness in the first direction as the third thickness.

5. The device according to claim 1, wherein the switching element is connected to the metal pad via a bonding material, the bonding material being conductive, and the second metal terminal is electrically connected to the metal pad by a via contact provided in the insulating member.

6. The device according to claim 1, further comprising:
a bonding pad provided on the front surface of the insulating member, the bonding pad being electrically connected to the first metal terminal by another via contact provided in the insulating member; and
a metal wire electrically connecting the light-emitting element and the bonding pad.

7. The device according to claim 1, further comprising:
a resin member sealing the light-receiving element, the light-emitting element, the switching element, and the metal pad at the front side of the insulating member.

8. A substrate used to manufacture the semiconductor device according to claim 1, the substrate comprising:
a base member including a plurality of the metal pads, a plurality of the first metal terminals, and a plurality of the second metal terminals,
the plurality of the metal pads being arranged on a front surface of the base member, the plurality of the first metal terminals and the plurality of the second metal terminals being arranged on a back surface of the base member,
the base member including first and second regions, the second region surrounding the first region, the first region including the plurality of the metal pads, the plurality of the first metal terminals and the plurality of the second metal terminals,
the base member having the first thickness in a second direction directed from the back surface toward the front surface of the base member, the plurality of the metal pads each having the second thickness in the second direction, the plurality of the second metal terminals each having the third thickness in the second direction, the first thickness being less than a combined thickness of the second and third thicknesses; and
at least one resin layer provided on the second region of the base member, the resin layer having a thickness in the second direction greater than the first thickness.

9. The substrate according to claim 8, further comprising:
another resin layer provided in the second region on the back surface of the base member,
the resin layer being provided on the front surface of the base member,
the second region including a portion positioned between the resin layer and said another resin layer.

10. The substrate according to claim 9, further comprising:
a first metal layer provided between the base member and the resin layer; and
a second metal layer provided between the base member and said another resin layer.

11. The substrate according to claim 10, wherein the first metal layer has the second thickness in the second direction, and the second metal layer has the third thickness in the second direction.

12. The substrate according to claim 9, wherein
the resin layer has the thickness in the second direction substantially equal to a thickness in the second direction of said another resin layer.

13. The substrate according to claim 8, wherein
the base member includes a plurality of the first regions, and
the second region surrounds the plurality of the first regions.

14. The substrate according to claim 8, comprising:
a plurality of the resin layers surrounding the first region of the base member.

15. A method for manufacturing the semiconductor device according to claim 1,
the method comprising:
mounting a plurality of the light-receiving elements and a plurality of the switching elements on a substrate,
the substrate including a base member and a resin layer, the base member including a first region and a second region, the second region surrounding the first region,
the first region including a plurality of the first metal terminals, a plurality of the second metal terminals, and a plurality of the metal pads,
the resin layer being provided on the second region of the base member and being thicker than the base member;
mounting a plurality of the light-emitting elements respectively on the plurality of the light-receiving elements;
electrically connecting the plurality of the light-receiving elements and the plurality of the switching elements respectively via metal wires;
electrically connecting the plurality of the light-emitting elements respectively to the plurality of the first metal terminals via other metal wires;
forming a resin member on the first region of the base member, the resin member sealing the plurality of the light-emitting elements, the plurality of the light-receiving elements, and the plurality of the switching elements; and
dividing the resin member and the first region of the base member into a plurality of the semiconductor devices by cutting the first region and the resin member after removing the second region from the first region, each of the plurality of the semiconductor devices includes the insulating member, the light-receiving element, the light-emitting element, the switching element, and the first and second metal terminals.

* * * * *